United States Patent
Sunaga et al.

(10) Patent No.: US 7,079,758 B2
(45) Date of Patent: Jul. 18, 2006

(54) PWM DRIVING APPARATUS

(75) Inventors: Hideki Sunaga, Tokyo (JP); Futoshi Araki, Tokyo (JP); Kaoru Tanaka, Tokyo (JP); Eiji Takahashi, Tokyo (JP)

(73) Assignee: Calsonic Kansei Corporation, Tokyo (JP)

( * ) Notice: Subject to any disclaimer, the term of this patent is extended or adjusted under 35 U.S.C. 154(b) by 254 days.

(21) Appl. No.: 10/797,816

(22) Filed: Mar. 9, 2004

(65) Prior Publication Data

US 2004/0179830 A1    Sep. 16, 2004

(30) Foreign Application Priority Data

Mar. 12, 2003    (JP)    ............... 2003-066439

(51) Int. Cl.
*H02P 7/06*    (2006.01)
(52) U.S. Cl. .................... 388/804; 318/599; 363/41
(58) Field of Classification Search .............. 318/77, 318/599, 700; 363/41; 388/804
See application file for complete search history.

(56) References Cited

U.S. PATENT DOCUMENTS

| | | | | |
|---|---|---|---|---|
| 3,978,424 A | | 8/1976 | Hobo et al. .................... 331/45 |
| 4,802,077 A | * | 1/1989 | Fujii et al. .................... 363/41 |
| 5,231,314 A | | 7/1993 | Andrews .................... 307/480 |
| 5,627,441 A | * | 5/1997 | Sakurai et al. .............. 318/599 |
| 6,088,246 A | * | 7/2000 | Okuyama et al. ............. 363/41 |
| 6,388,416 B1 | * | 5/2002 | Nakatani et al. ............ 318/700 |
| 6,704,212 B1 | * | 3/2004 | Furukawa et al. ............ 363/41 |
| 6,775,158 B1 | * | 8/2004 | Fu ................ 363/41 |
| 6,891,342 B1 | * | 5/2005 | Nakamura et al. ............ 318/77 |
| 2002/0047533 A1 | | 4/2002 | Fushimi et al. ................ 315/82 |
| 2004/0027105 A1 | * | 2/2004 | Nakamura et al. .......... 323/267 |

FOREIGN PATENT DOCUMENTS

| | | |
|---|---|---|
| FR | 2 792 159 A | 10/2000 |
| FR | 2 809 924 A | 12/2001 |
| JP | 2002-043910 | 2/2002 |
| JP | 2002-315392 | 10/2002 |

* cited by examiner

*Primary Examiner*—Paul Ip
(74) *Attorney, Agent, or Firm*—J.C. Patents

(57) ABSTRACT

When a PWM signal generating unit (10) sets a duty D of a PWM signal based on command signals (10c), the PWM signal generating unit (10) sets a phase difference $\phi$ between each of the PWM signals based on a relation formula of $\phi$ (degree)=360 (degree)×D (%)/100 (%), and generates and outputs first PWM signals (10a) and second PWM signals (10b) in which the duty is D (%) and the phase difference is $\phi$ (degree). The first PWM signals (10a) and the second PWM signals (10b) are respectively supplied to a first load driving circuit (21) and a second load driving circuit (22) to operate a first motor fan (3) and a second motor fan (4) by a PWM control, respectively.

7 Claims, 5 Drawing Sheets

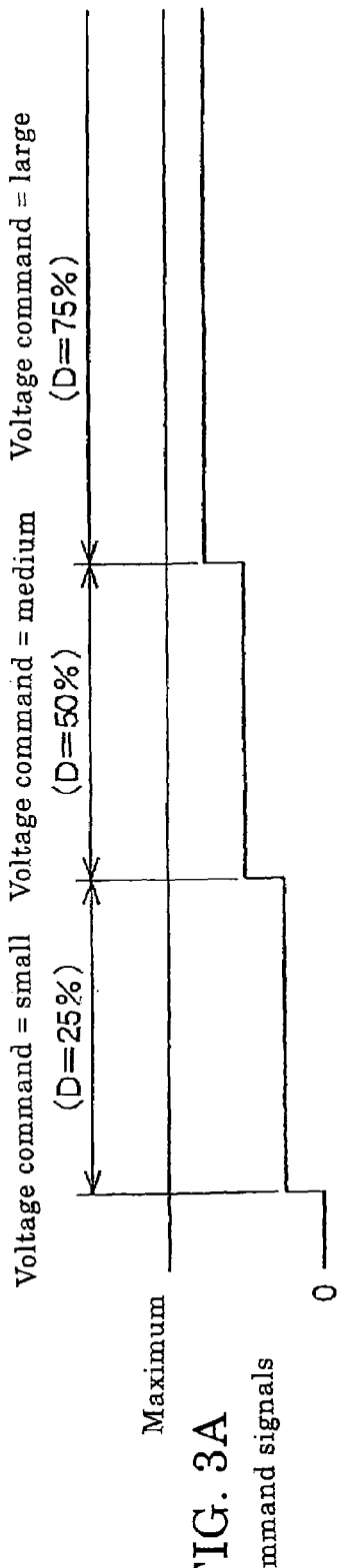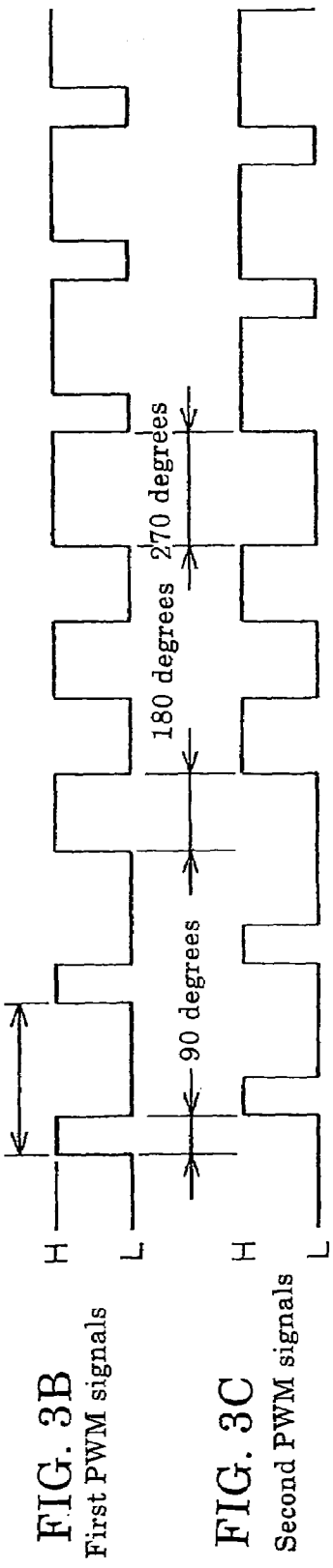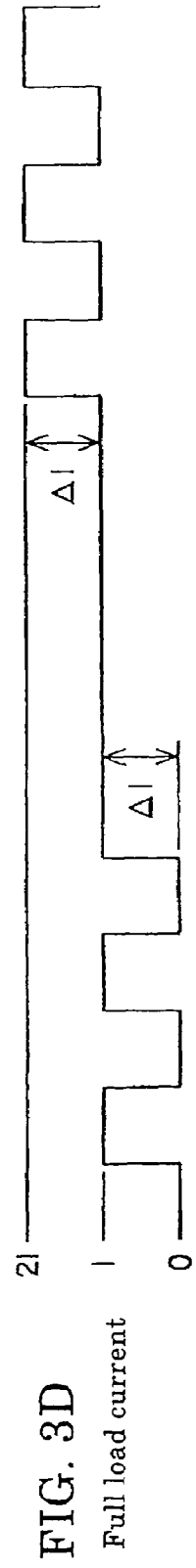
FIG. 3A
Command signals
FIG. 3B
First PWM signals
FIG. 3C
Second PWM signals
FIG. 3D
Full load current

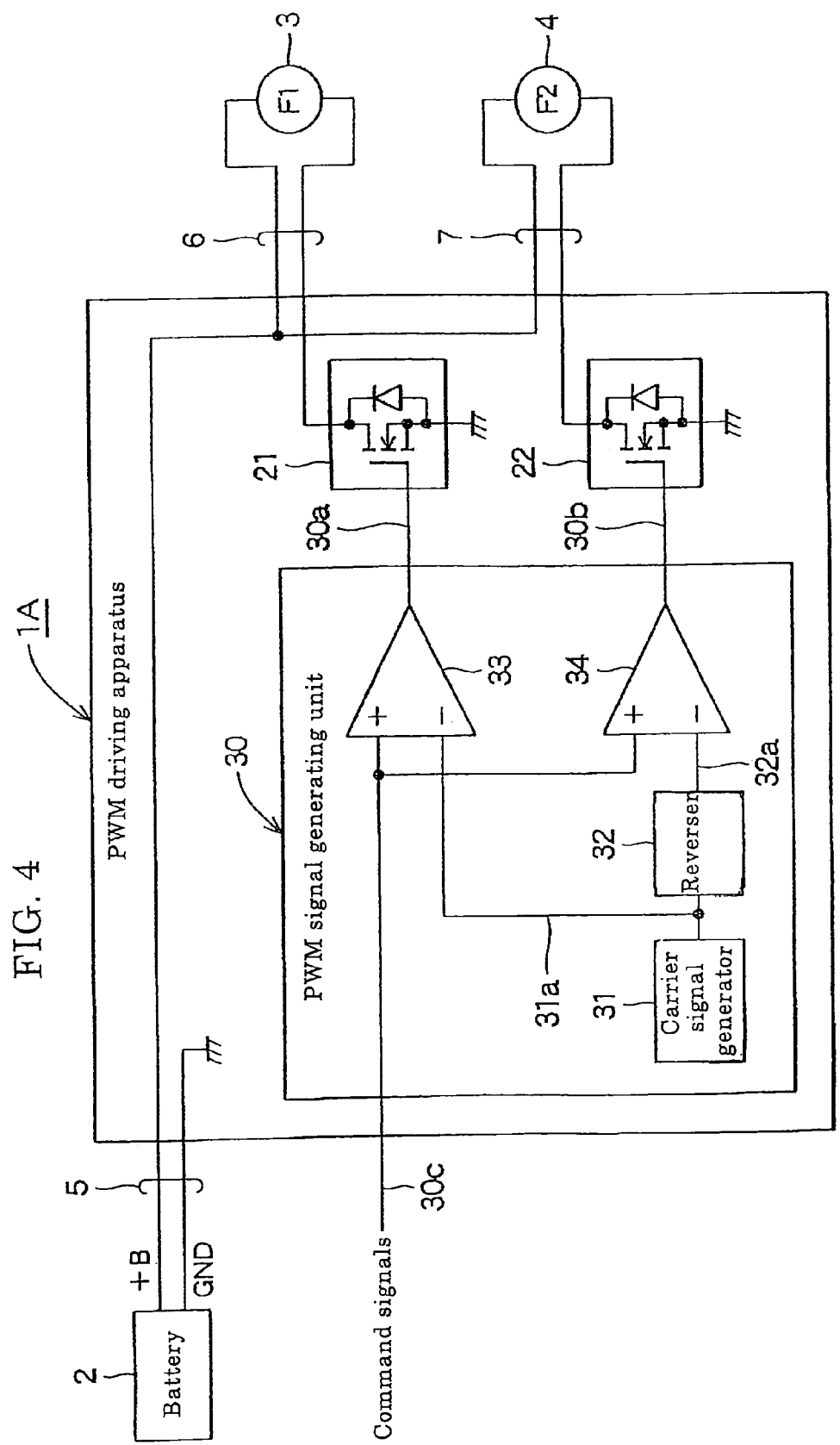

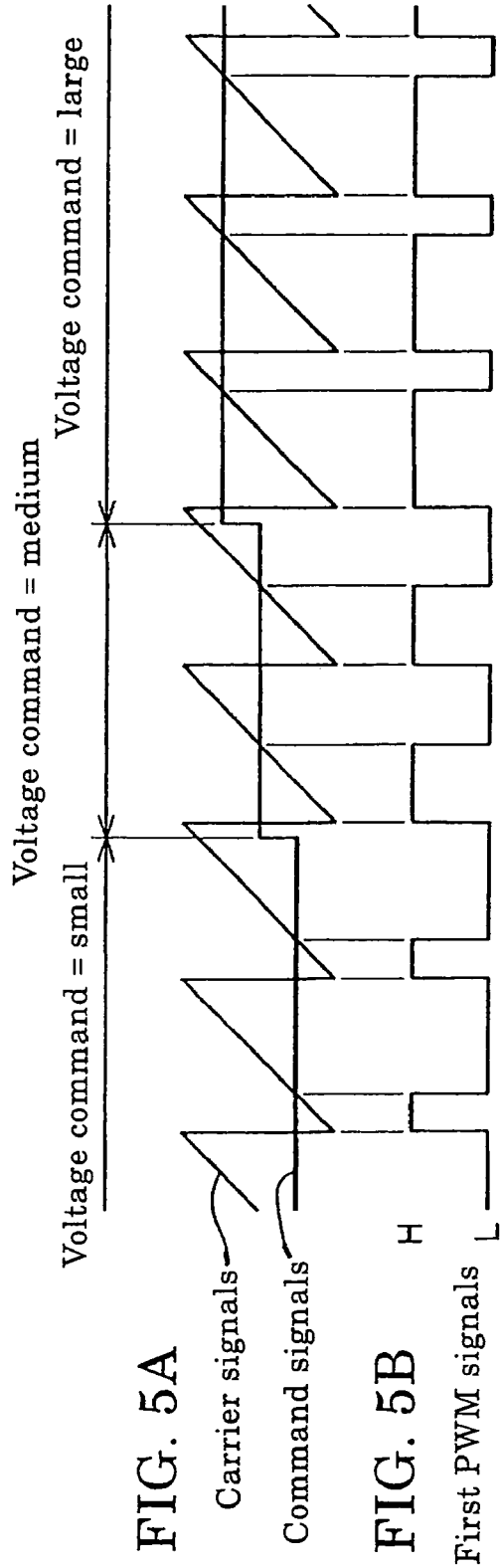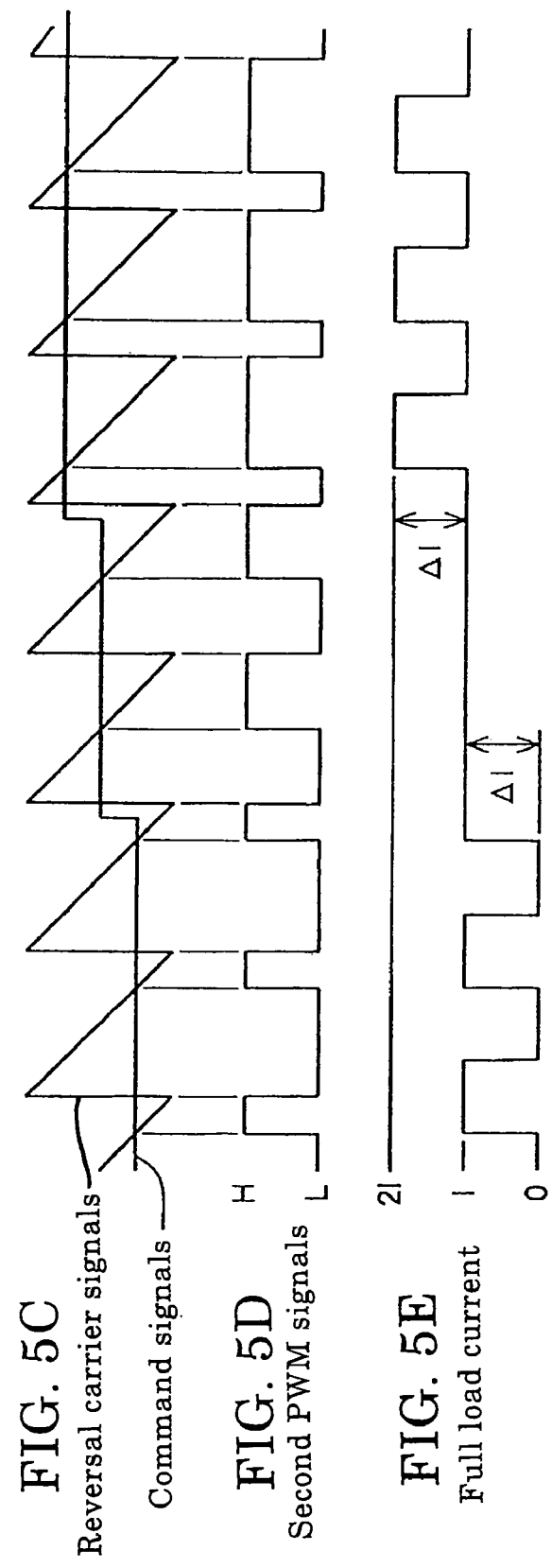

PWM DRIVING APPARATUS

BACKGROUND OF THE INVENTION

1. Field of the Invention

The present invention relates to a PWM driving apparatus which drives two loads connected in parallel to a power source by a PWM (Pulse Width Modulation) control.

2. Description of the Prior Art

Heretofore, there is described, for example in JP-A 2002-43910, a load controlling device which drives a plurality of loads connected in parallel to a power source. Such a load controlling device is of a pulse width modulation (PWM) control system for simultaneously driving first and second loads (for example, headlights) connected to the power source (for example, in-vehicle battery). In addition, this load controlling device includes first and second switching elements for applying power to the first and second loads respectively, and a controlling circuit which outputs first PWM signals to allow the first switching element to be turned ON and OFF upon receipt of signals for commanding driving and second PWM signals to allow the second switching element to be turned ON and OFF upon receipt of the signals for commanding driving, while the phase of the first PWM signals is staggered from that of the second PWM signals.

According to this structure, since the phases of the first and second PWM signals are staggered from each other, load currents flowing to the first and second loads will not be increased or decreased at the same timing, and the rate of variation in the entire load current becomes less as compared with a case that the two loads are driven with same phases. As a result, current as flowing in wiring from the power source to each load will not vary significantly, thus generation of an electromagnetic noise can be suppressed. Furthermore, an amount of variation in the entire load current can be made less by matching the rising timing of first PWM signals with the falling timing of the second PWM signals.

Also, there is described, for example in JP-A 2002-315392, a motor fan device for being mounted in a vehicle which is configured to reduce conduction noise generated due to a current ripple of an output current of the power source by driving two motor fans in such a manner that the current ripple of the output current of the power source becomes less. In this motor fan device, separate switch elements are prepared for the two motor fans respectively, and those respective switch elements are turned ON or OFF under the PWM control, while the ON-OFF operation is staggered between the switch elements by a half cycle. Thereby, driving currents are distributed from the power source to the respective motor fans, while being staggered from each other by a half cycle.

In the above mentioned devices, it is possible to suppress the generation of the electromagnetic noise by staggering the phases of the two PWM signals and thus shifting the timing of the power application between the respective loads. However, an amount of generation of the electromagnetic noise fluctuates corresponding to the duty of the PWM signals in a case that a phase difference between the two PWM signals is set to be constant. For example, when the phase difference between the two PWM signals is set to be 180 degrees (staggered by a half cycle), the amount of generation of the electromagnetic noise is less when the duty of the PWM signals is 50%, and the amount of generation of the electromagnetic noise increases when the duty of the PWM signals is not 50% as compared with the case when the duty is 50%. Accordingly, when an amount of electric power to be supplied to the load is varied (more specifically, when the duty of the PWM signals is varied), the amount of generation of the electromagnetic noise fluctuates, thus there is a case that the electromagnetic noise may be heard from a car-mounted radio as a disturbing noise.

SUMMARY OF THE INVENTION

The present invention has been made in view of the above mentioned problem. Therefore, it is an object of the present invention to provide a PWM driving apparatus configured to reduce generation of an electromagnetic noise by changing difference in phase between two PWM signals according to the duty of the PWM signals.

To solve the aforementioned problem, a PWM driving apparatus according to the present invention comprises a PWM signal generating unit for generating first PWM signals and second PWM signals; a first load-driving circuit which performs switching of power-supplying to a first load based on the first PWM signals; and a second load-driving circuit which performs switching of power-supplying to a second load based on the second PWM signals, the PWM signal generating unit comprises a duty setting portion for setting a duty based on command signals, a phase difference setting portion for setting a phase difference based on the duty, and a PWM signal generating portion for generating the first PWM signals and the second PWM signals based on the duty and the phase difference.

The PWM driving apparatus according to the present invention generates the first and the second PWM signals of the previously set phase difference based on the duties of the PWM signals and performs a PWM control of power supplying to each of the respective loads. Generation of an electromagnetic noise can be made less throughout the entire range of the duties by previously setting the phase difference in which the generation of the electromagnetic noise becomes less corresponding to the duty. Also, since the PWM signal generating unit comprises the duty setting portion for setting the duty based on the command signals, the phase difference setting portion for setting the phase difference based on the duty, and the PWM signal generating portion for generating the first and the second PWM signals based on the duty and the phase difference, it becomes easy to generate the respective PWM signals by software control, for example, by using a microcomputer.

Here, when the phase difference $\phi$ (unit is degree) and the duty D (unit is %) meet the following relation, $\phi$ (degree)=360 (degree)×D (%)/100 (%), or $\phi$ (degree)=360 (degree)−{360 (degree)×D (%)/100 (%)}, the rising timing of first PWM signals and the falling timing of the other PWM signals can be coincided with each other. Accordingly, it is possible to reduce variations in a load current, and thus the generation of the electromagnetic noise due to the variations in the load current can be reduced.

Another PWM driving apparatus according to the present invention comprises a PWM signal generating unit for generating first PWM signals and second PWM signals; a first load-driving circuit which performs switching of power-supplying to a first load based on the first PWM signals; and a second load-driving circuit which performs switching of power-supplying to a second load based on the second PWM signals, the PWM signal generating unit comprises a carrier signal generator for generating carrier signals which are in a saw-tooth wave pattern, a first comparator for generating the first PWM signals by comparing the carrier signals with command signals, a reverser for generating reversal carrier signals in which the carrier signals are reversed, and a second comparator for generating the second PWM signals by comparing the reversal carrier signals with the command signals.

The another PWM driving apparatus according to the present invention is structured to generate the first PWM signals based on the carrier signals, and to generate the second PWM signals based on the reversal carrier signals. Therefore, a circuit structure can be simplified since a single carrier signal generator suffices. In addition, by providing the carrier signals as the saw-tooth wave pattern, it is possible to generate the first and the second PWM signals with the phase difference which corresponds to the duty of the PWM signals.

Furthermore, when each of the loads is a motor fan for being mounted in a vehicle, because the electromagnetic noise (conduction noise and radiated noise) generated due to a PWM operation of each of the motor fans can be lowered, noise which interfuses to an in-vehicle radio and the like can also be reduced.

BRIEF DESCRIPTION OF THE DRAWINGS

FIGS. 3A to 3D show a timing chart showing the operation of the PWM driving apparatus according to the first embodiment of the present invention, wherein FIG. 3A shows changes in command signals, FIG. 3B shows changes in first PWM signals, FIG. 3C shows changes in second PWM signals, and FIG. 3D shows changes in a full load current.

FIG. 4 is a block diagram of a PWM driving apparatus according to a second embodiment of the present invention.

FIGS. 5A to 5E show a timing chart showing the operation of the PWM driving apparatus according to the second embodiment of the present invention, wherein FIG. 5A shows changes in carrier signals and command signals, FIG. 5B shows changes in first PWM signals, FIG. 5C shows changes in reversal carrier signals and the command signals, FIG. 5D shows second PWM signals, and FIG. 5E shows the full load current.

DETAILED DESCRIPTION OF THE PREFERRED EMBODIMENTS

Hereinafter, embodiments of the present invention will be described with reference to the accompanying drawings.

Figure 1:
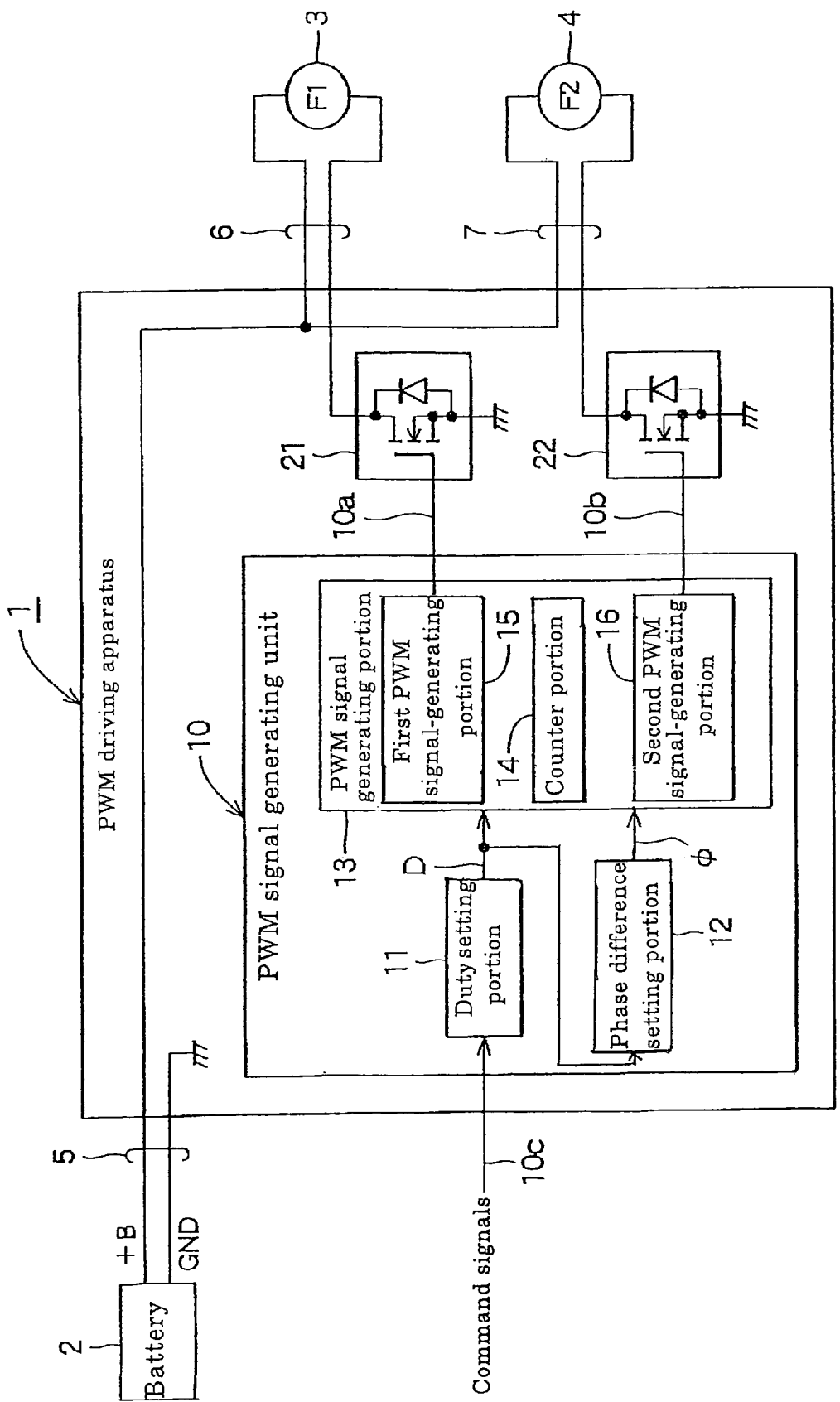
FIG. 1 is a block diagram of a PWM driving apparatus according to a first embodiment of the present invention.

FIG. 1 is a block diagram showing a PWM driving apparatus according to a first embodiment of the present invention. The PWM driving apparatus 1 shown in FIG. 1 receives supplying of an electric power from a battery 2 mounted in a vehicle and operates two motor fans 3, 4 (for example, a fan F1 for cooling a radiator and a fan F2 for cooling a condenser) as first and second loads, respectively, under a PWM control. In addition, reference numeral 5 denotes a battery power-supplying cable, and reference numerals 6, 7 denote power-supplying cables for the respective motor fans. Reference numeral +B denotes an anode of the battery 2, and reference numeral GND denotes a cathode (ground) of the battery 2.

This PWM driving apparatus 1 includes a PWM signal generating unit 10 which generates first PWM signals 10$a$ and second PWM signals 10$b$ based on command signals 10$c$, a first load-driving circuit 21 which performs switching of the electric power to be supplied to the first motor fan 3 on the basis of the first PWM signals 10$a$, and a second load-driving circuit 22 which performs switching of the electric power to be supplied to the second motor fan 4 on the basis of the second PWM signals 10$b$. Each of the load-driving circuits 21, 22 is structured by using a semiconductor switching element for power supply, such as MOS-FET.

The PWM signal generating unit 10 is structured to generate each of the PWM signals 10$a$, 10$b$ by software control utilizing a microcomputer. This PWM signal generating unit 10 includes a duty setting portion 11 for setting a duty D of each of the PWM signals 10$a$, 10$b$ on the basis of the command signals 10$c$, a phase difference setting portion 12 for setting a phase difference $\phi$ between the PWM signals 10$a$, 10$b$ on the basis of the set duty D, and a PWM signal generating portion 13 for generating each of the PWM signals 10$a$, 10$b$ on the basis of the duty D and the phase difference $\phi$.

The phase difference setting portion 12 calculates the phase difference $\phi$ (unit is degree) based on a following formula 1 with respect to the duty D (unit is %).

$$\phi(\text{degree}) = 360(\text{degree}) \times D(\%)/100(\%) \quad \text{(formula 1)}$$

In addition, the phase difference setting portion 12 may calculate the phase difference $\phi$ based on a following formula 2 with respect to the duty D.

$$\phi(\text{degree}) = 360(\text{degree}) - \{360(\text{degree}) \times D(\%)/100(\%)\} \quad \text{(formula 2)}$$

Meanwhile, the phase difference setting portion 12 may include a correspondence table between the duty D and the phase difference $\phi$, and obtain the phase difference $\phi$ by referring to that correspondence table.

The PWM signal generating portion 13 includes a counter portion 14 which performs stepping with a cycle significantly shorter than that of the PWM signals, a first PWM signal-generating portion 15 for generating the first PWM signals 10$a$ of the specified duty D by referring to a count of the counter portion 14, and a second PWM signal-generating portion 16 for generating the second PWM signals 10$b$ of the specified duty D by referring to the count of the counter portion 14 and having the specified phase difference $\phi$ with respect to the first PWM signals 10$a$.

Figure 2:
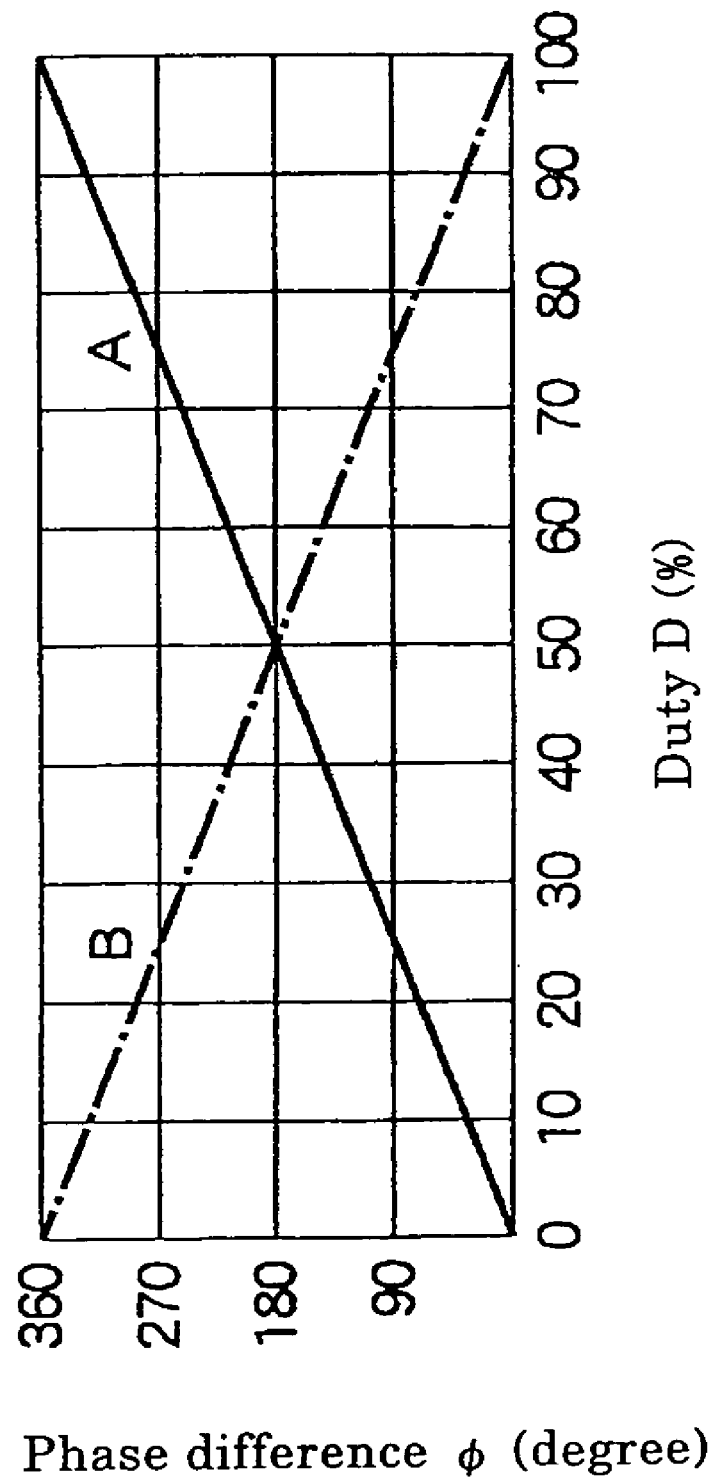
FIG. 2 is a graph showing relation between the duty of PWM signals and phase differences of the respective PWM signals in the PWM driving apparatus according to the first embodiment of the present invention.

FIG. 2 is a graph showing relation between the duty of the PWM signals and the phase differences of the respective PWM signals. In FIG. 2, the horizontal axis shows the duty of the PWM signals, and the vertical axis shows the phase difference $\phi$ between the first PWM signals and the second PWM signals. A characteristic A shown by a solid line corresponds to the above mentioned formula 1, and a characteristic B shown by a dashed line corresponds to the above mentioned formula 2.

FIGS. 3A–3D are a timing chart showing the operation of the PWM driving apparatus according to the first embodiment of the present invention. FIG. 3A shows the command signals 10$c$, FIG. 3B shows the first PWM signals 10$a$, FIG. 3C shows the second PWM signals 10$b$, and FIG. 3D shows a full load current. The full load current is a sum of currents supplied to the two motor fans 3, 4. Here, it is shown by way of example that the PWM signals of the duties 25%, 50% and 75% are generated with respect to three levels, small, medium and large levels, of voltage commands of the command signals 10$c$.

When the voltage command is small (it is supposed here that "small" corresponds to the duty of 25%), the PWM signal generating portion 13 generates and outputs the first PWM signals 10a in which the duty is 25%, and generates and outputs the second PWM signals 10b in which the duty is 25% and the phase difference is 90 degrees with respect to the first PWM signals 10a.

When the voltage command is medium (it is supposed here that "medium" corresponds to the duty of 50%), the PWM signal generating portion 13 generates and outputs the first PWM signals 10a in which the duty is 50%, and generates and outputs the second PWM signals 10b in which the duty is 50% and the phase difference is 180 degrees with respect to the first PWM signals 10a.

When the voltage command is large (it is supposed here that "large" corresponds to the duty of 75%), the PWM signal generating portion 13 generates and outputs the first PWM signals 10a in which the duty is 75%, and generates and outputs the second PWM signals 10b in which the duty is 75% and the phase difference is 270 degrees with respect to the first PWM signals 10a.

As described above, since the respective PWM signals 10a, 10b are generated with the phase differences which complies with the duties, the falling timing of the first PWM signals 10a and the rising timing of the second PWM signals 10b can be coincided with each other. Therefore, because application of power to the second motor fan 4 is started at the same timing when power application to the first motor fan 3 is shut off, the number of times of variations in the full load current can be reduced. Furthermore, it is possible to offset a harmonic noise generated when the power application to the first motor fan 3 is shut off with a harmonic noise generated when the power application to the second motor fan 4 is started. Accordingly, generation of an electromagnetic noise (conduction noise and radiated noise) can be suppressed.

In addition, the rising timing of the first PWM signals 10a and the falling timing of the second PWM signals 10b coincides with each other when the second PWM signals 10b having a delay of the phase difference calculated according to the above-mentioned formula 2 with respect to the first PWM signals 10a are generated. Also in this case, the number of times of variations in the full load current is reduced, and because the harmonic noise generated when the power application is shut off and the harmonic noise generated when the power application is started can be offset, the generation of the electromagnetic noise (conduction noise and radiated noise) can be suppressed.

Meanwhile, the PWM signal generating portion 13 may be configured to generate and output the second PWM signals 10b of the phase difference calculated according to the above-mentioned formula 2 with respect to the first PWM signals 10a when the duty of respective PWM signals is not less than 50%. For example, the PWM signal generating portion 13 creates and outputs the second PWM signals 10b having the phase difference of 90 degrees with respect to the first PWM signals 10a when the duty is 75%. Accordingly, it is possible to bring forward the timing of supplying power to the second load.

Although variations in the full load current amount to 2 I (I is the current of one motor fan) when the two motor fans 3, 4 are operated in parallel based on either one of the PWM signals, variations in the full load current amount to I (ΔI) as shown in FIG. 3D by staggering phases between the PWM signals 10a, 10b. By reducing the variations in the full load current as such, it is possible to reduce the generation of the electromagnetic noise due to variations in the current.

Furthermore, since the power is alternately applied to the motor fans 3, 4 when the duty of the respective PWM signals 10a, 10b is 50%, no variation in the full load current will occur, and thus the generation of the electromagnetic noise becomes distinctly less.

FIG. 4 is a block diagram of a PWM driving apparatus according to a second embodiment of the present invention. The PWM driving apparatus 1A shown in FIG. 4 receives the supplying of the electric power from a battery 2 mounted in the vehicle and operates two motor fans 3, 4 (for example, a fan F1 for cooling the radiator and a fan F2 for cooling the condenser) as first and second loads, respectively, under the PWM control. Meanwhile, reference numeral 5 denotes a batter-power supplying cable, and reference numerals 6 and 7 denote power-supplying cables for the motor fans. Reference numeral +B denotes an anode of the battery 2, and reference numeral GND denotes a cathode (ground) of the battery 2.

This PWM driving apparatus 1A includes a PWM signal generating unit 30 which generates first PWM signals 30a and second PWM signals 30b based on command signals 30c, a first load-driving circuit 21 which performs switching of the electric power to be supplied to the first motor fan 3 on the basis of the first PWM signals 30a, and a second load-driving circuit 22 which performs switching of the electric power to be supplied to the second motor fan 4 on the basis of the second PWM signals 30b. Each of the respective load-driving circuits 21, 22 is structured by using the semiconductor switching element for power supply, such as the MOS-FET.

The PWM signal generating unit 30 includes a carrier signal generator 31 for generating carrier signals 31a which are in a saw-tooth wave pattern, a reverser 32 for outputting reversal carrier signals 32a by reversing the carrier signals 31a, a first comparator 33 which generates the first PWM signals 30a by comparing the command signals 30c with the carrier signals 31a, and a second comparator 34 which generates the second PWM signals 30b by comparing the command signals 30c with the reversal carrier signals 32a.

The carrier signal generator 31 is structured by using a saw-tooth wave pattern generating circuit which is in an analog-circuit structure. Meanwhile, the carrier signal generator 31 may be structured by using a D/A converter. The reverser 32 is structured by using an operational amplifier or the like. The first comparator 33 generates an output of H level during when a voltage value of the command signals 30c exceeds that of the carrier signals 31a, and generates an output of L level otherwise. The second comparator 34 generates the output of H level during when the voltage value of the command signals 30c exceeds that of the reversal carrier signals 32a, and generates the output of L level otherwise.

FIGS. 5A–5E are a timing chart showing the operation of the PWM driving apparatus according to the second embodiment of the present invention. FIG. 5A shows the carrier signals 31a and the command signals 30c supplied to respective input terminals of the first comparator 33, and FIG. 5B shows the first PWM signals 30a outputted from the first comparator 33. FIG. 5C shows the reversal carrier signals 32a and the command signals 30c supplied to respective input terminals of the second comparator 34, and FIG. 5D shows the second PWM signals 30b outputted from the second comparator 34. Here, it is shown by way of example that the PWM signals of the duties 25%, 50% and 75% are generated with respect to three levels, small, medium and large levels, of voltage commands of the command signals 30c. FIG. 5E shows the full load current, and this full load current is a sum of currents supplied to the two motor fans 3, 4.

By generating the first PWM signals 30a on the basis of the saw-tooth wave patterned carrier signals 31a and generating the second PWM signals 30b on the basis of the saw-tooth wave patterned reversal carrier signals 32a, it is possible to provide the phase difference (cycle staggered) which corresponds to the duty of the PWM signal between the PWM signals 30a, 30b. For example, the phase difference becomes 270 degrees (−90 degrees) when the duty is 25%, the phase difference becomes 180 degrees when the duty is 50%, and the phase difference becomes 90 degrees (−270 degrees) when the duty is 75%.

Although variations in the full load current amount to 2 I (I is the current of one motor fan) when the two motor fans 3, 4 are operated in parallel based on either one of the PWM signals, variations in the full load current amount to I (ΔI) as shown in FIG. 5E by staggering cycles between the PWM signals 30a, 30b. By reducing the variations in the full load current as such, it is possible to reduce the generation of the electromagnetic noise due to variations in the current.

Also, because the falling timing of the second PWM signals 30b and the rising timing of the first PWM signals 30a coincides with each other, it is possible to offset a harmonic noise generated when the power application to the second motor fan 4 is shut off with a harmonic noise generated when the power application to the first motor fan 3 is started. Accordingly, generation of an electromagnetic noise can be suppressed.

Furthermore, since the power is alternately applied to the motor fans 3, 4 when the duty of the respective PWM signals 30a, 30b is 50%, no variation in the full load current will occur, and thus the generation of the electromagnetic noise becomes distinctly less.

As shown in FIG. 1 and FIG. 4, the wire length of the battery power-supplying cable 5 which supplies the battery power from the battery 2 mounted in the vehicle to the PWM driving apparatuses 1, 1A often becomes large in the vehicle such as an automobile. Accordingly, when the respective motor fans 3, 4 are synchronously operated, the variations in the current of the battery power-supplying cable 5 are large and thus the radiated noise is generated from the battery power-supplying cable 5. As a result, there is a possibility that the radiated noise may interfuse to the in-vehicle radio and the like. On the contrary, because the variations in the load current are reduced by staggering the timings of applying the power to the respective motor fans 3, 4 in the PWM driving apparatus 1, 1A according to the present embodiments, the generation of the conduction noise or the radiated noise (radio noise) due to the variations in the load current can be lowered.

In addition, radiation of the radio noise from the battery power-supplying cable 5 can be reduced even more by using a twisted-pair cable for the battery power-supplying cable 5. Also, it is possible to reduce the noise radiated from the power-supplying cables 6, 7 for supplying the electric power to the respective motor fans 3, 4 by using a twisted-pair cable as each cable.

As described above, because the PWM driving apparatus according to the present invention is structured to generate the first and the second PWM signals with the phase difference which is previously set corresponding to the duty of the PWM signals and to respectively perform the PWM control of the power to be supplied to the respective loads, it is possible to reduce the generation of the noise throughout the entire range of the duties.

What is claimed is:

1. A PWM driving apparatus comprising:
a PWM signal generating unit for generating first PWM signals and second PWM signals;
a first load-driving circuit which performs switching of power-supplying to a first load based on said first PWM signals; and
a second load-driving circuit which performs switching of power-supplying to a second load based on said second PWM signals,
wherein said PWM signal generating unit comprises a duty setting portion for setting a duty based on command signals, a phase difference setting portion for setting a phase difference based on said duty, and a PWM signal generating portion for generating said first PWM signals and said second PWM signals based on said duty and said phase difference, and
whereby the phase difference between said first PWM signals and said second PWM signals is configured to be changed according to said duty set by said duty setting portion.

2. The PWM driving apparatus according to claim 1, wherein a following formula is satisfied:

$$\phi(degree)=360(degree)\times D(\%)/100$$

if said phase difference is φ (unit is degree) and said duty is D (unit is %).

3. The PWM driving apparatus according to claim 1, wherein a following formula is satisfied:

$$\phi(degree)=360(degree)-\{360(degree)\times D(\%)/100(\%)\}$$

if said phase difference is φ (unit is degree) and said duty is D (unit is %).

4. A PWM driving apparatus comprising:
a PWM signal generating unit for generating first PWM signals and second PWM signals;
a first load-driving circuit which performs switching of power-supplying to a first load based on said first PWM signals; and
a second load-driving circuit which performs switching of power-supplying to a second load based on said second PWM signals,
wherein said PWM signal generating unit comprises a carrier signal generator for generating carrier signals which are in a saw-toot wave pattern, a first comparator for generating the first PWM signals by comparing said cater signals wit command signals, a reverser for generating reversal cater signals in which said cater signals are reversed, and a second comparator for generating the second PWM signals by comparing said reversal carrier signals with said command signals, and
wherein said first PWM signals and said second PWM signals are generated such that falling timing of one of said first PWM signals and said second PWM signals and rising timing of the other of said first PWM signals and said second PWM signals coincide with each other.

5. The PWM driving apparatus according to claim 1, wherein said first load and said second load are motor fans for being mounted in a vehicle.

6. The PWM driving apparatus according to claim 4, wherein said first load and said second load are motor fans for being mounted in a vehicle.

7. The PWM driving apparatus according to claim 1, wherein the phase difference between said first PWM signals and said second PWM signals is configured to be changed such that falling timing of one of said first PWM signals and said second PWM signals and rising timing of the other of said first PWM signals and said second PWM signals coincide wit each other.

* * * * *